(12) United States Patent
Yuan

(10) Patent No.: US 9,685,461 B2
(45) Date of Patent: Jun. 20, 2017

(54) DISPLAY DEVICE, ARRAY SUBSTRATE AND METHOD FOR MANUFACTURING THE SAME

(71) Applicant: BOE TECHNOLOGY GROUP CO., LTD., Beijing (CN)

(72) Inventor: Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 34 days.

(21) Appl. No.: 14/420,774

(22) PCT Filed: Apr. 29, 2014

(86) PCT No.: PCT/CN2014/076477
§ 371 (c)(1),
(2) Date: Feb. 10, 2015

(87) PCT Pub. No.: WO2015/100894
PCT Pub. Date: Jul. 9, 2015

(65) Prior Publication Data
US 2015/0372021 A1    Dec. 24, 2015

(30) Foreign Application Priority Data
Jan. 3, 2014    (CN) .......................... 2014 1 0004069

(51) Int. Cl.
*H01L 21/00* (2006.01)
*H01L 21/84* (2006.01)
(Continued)

(52) U.S. Cl.
CPC ........ *H01L 27/1225* (2013.01); *H01L 21/441* (2013.01); *H01L 21/477* (2013.01);
(Continued)

(58) Field of Classification Search
CPC ................. H01L 21/441; H01L 21/477; H01L 21/47635; H01L 27/127; H01L 27/1222;
(Continued)

(56) References Cited

U.S. PATENT DOCUMENTS 6,537,840 B2 * 3/2003 Tseng .................. G02F 1/13458
438/158
8,507,301 B2    8/2013 Choi et al.
(Continued)

FOREIGN PATENT DOCUMENTS

CN    1728351 A    2/2006
CN    1797773 A    7/2006
(Continued)

OTHER PUBLICATIONS

Chinese Office Action dated Oct. 9, 2015 in CN 201410004069.1.
(Continued)

*Primary Examiner* — Cheung Lee
*Assistant Examiner* — Stephen C Smith
(74) *Attorney, Agent, or Firm* — Collard & Roe, P.C.

(57) ABSTRACT

A manufacturing method of an array substrate, an array substrate and a display device are provided. The array substrate includes a first thin film transistor and a pixel electrode (327), wherein, an active layer (324) and source and drain electrodes in the first thin film transistor as well as the pixel electrode (327) are formed by one patterning process. According to the invention, an array substrate with good performance can be manufactured only by three photolithography processes. Thus, the production cycle of a thin film transistor is shorted greatly, characteristics of the thin film transistor is improved, and meanwhile, yield of products is enhanced greatly.

11 Claims, 3 Drawing Sheets

(51) Int. Cl.
    H01L 27/12      (2006.01)
    H01L 29/66      (2006.01)
    H01L 29/786     (2006.01)
    H01L 21/441     (2006.01)
    H01L 21/4763    (2006.01)
    H01L 21/477     (2006.01)
    H01L 29/417     (2006.01)
    H01L 29/45      (2006.01)
    H01L 29/51      (2006.01)

(52) U.S. Cl.
    CPC ...... *H01L 21/47635* (2013.01); *H01L 27/127* (2013.01); *H01L 27/1222* (2013.01); *H01L 27/1288* (2013.01); *H01L 29/41733* (2013.01); *H01L 29/45* (2013.01); *H01L 29/511* (2013.01); *H01L 29/517* (2013.01); *H01L 29/518* (2013.01); *H01L 29/66765* (2013.01); *H01L 29/66772* (2013.01); *H01L 29/7869* (2013.01); *H01L 29/78654* (2013.01); *H01L 29/78669* (2013.01); *H01L 29/78678* (2013.01); *H01L 29/66969* (2013.01)

(58) Field of Classification Search
    CPC ........... H01L 27/1225; H01L 27/01288; H01L 29/45; H01L 29/511; H01L 29/517; H01L 29/518; H01L 29/41733; H01L 29/66765; H01L 29/66772; H01L 29/78678; H01L 29/78654; H01L 29/7869; H01L 29/66969
    See application file for complete search history.

(56) References Cited

U.S. PATENT DOCUMENTS

| | | | | |
|---|---|---|---|---|
| 8,609,477 | B2* | 12/2013 | Song | H01L 27/1214 257/E21.535 |
| 2007/0020910 | A1* | 1/2007 | Park | G03F 7/425 438/612 |
| 2008/0001155 | A1* | 1/2008 | Jung | G02F 1/13439 257/59 |
| 2011/0031493 | A1* | 2/2011 | Yamazaki | H01L 27/1214 257/43 |
| 2011/0156024 | A1* | 6/2011 | Koyama | G11C 11/412 257/43 |
| 2012/0028421 | A1* | 2/2012 | Yang | H01L 21/32138 438/158 |
| 2012/0184060 | A1* | 7/2012 | Song | H01L 27/1214 438/34 |
| 2012/0320299 | A1 | 12/2012 | Kim et al. | |
| 2014/0117359 | A1 | 5/2014 | Yuan et al. | |
| 2014/0117371 | A1 | 5/2014 | Ma | |

FOREIGN PATENT DOCUMENTS

| | | |
|---|---|---|
| CN | 101656232 A | 2/2010 |
| CN | 102651343 A | 8/2012 |
| CN | 103077943 A | 5/2013 |
| CN | 103123910 A | 5/2013 |
| CN | 103745954 A | 4/2014 |
| CN | 103745955 A | 4/2014 |
| KR | 101245210 B1 | 3/2013 |

OTHER PUBLICATIONS

International Search Report and Written Opinion of the International Searching Authority with Notice of Transmittal of the International Search Report and Written Opinion of PCT/CN2014/076477 in Chinese, mailed Sep. 26, 2014.

Second Chinese Office Action in Chinese Application No. 201410004069.1, mailed Apr. 5, 2016 with English translation.

English translation of the International Preliminary Report on Patentability and Written Opinion of the International Searching Authority of PCT/CN2014/076477, issued Jul. 5, 2016.

* cited by examiner

DISPLAY DEVICE, ARRAY SUBSTRATE AND METHOD FOR MANUFACTURING THE SAME

CROSS REFERENCE TO RELATED APPLICATIONS

This application is the National Stage of PCT/CN2014/076477 filed on Apr. 29, 2014, which claims priority under 35 U.S.C. §119 of Chinese Application No. 201410004069.1 filed on Jan. 3, 2014, the disclosure of which is incorporated by reference.

Embodiments of the present invention relate to a display device, an array substrate and a method for manufacturing the same.

BACKGROUND

In recent years, the display technology has been developed rapidly, and for example, the thin film transistor technology has been developed from a previous a-Si (amorphous silicon) thin film transistor to a LTPS (low temperature polycrystalline silicon) thin film transistor, an MILC (metal induced lateral crystallization) thin film transistor, an Oxide thin film transistor, or the like at present. While the luminous technology has also been developed from a previous LCD (liquid crystal display), PDP (plasma display panel) to an OLED (organic light emitting diode), AMOLED (active matrix organic light emitting diode), or the like at present. An organic light emitting display is a new generation of display devices, and as compared to a liquid crystal display, it has many merits, such as, self luminous, fast response speed, wide viewing angle, and so on, and can be used for flexible display, transparent display, 3D (three-dimensionally stereoscopic) display, etc. But no matter it is liquid crystal display or organic light emitting display, it is necessary to provide each pixel with a switch (a thin film transistor) in control of the pixel, and with the aid of a driving circuit, each pixel can be controlled independently, without bringing about crosstalk and other effects on other pixels.

An Oxide thin film transistor widely used at present adopts an oxide semiconductor as an active layer, has the traits of large mobility, high on-state current, better switching characteristic and better uniformity, and is adaptable to the applications in need of fast response and larger current, such as, high-frequency, high-resolution and large-scale displays, organic light emitting displays and so on.

In prior art, the manufacturing process of Oxide thin film transistors usually requires six masks (exposures), which are used for forming a gate line and a gate electrode, a gate insulating layer, an active layer, an etch stop layer, source and drain electrodes, a passivation layer and a via hole, respectively. Researches show that, a six-mask exposure process has caused unstable performance and a longer production cycle for the device, and has led to a corresponding increase in the production cost.

SUMMARY

According to embodiments of the present invention, there are provided a display device, an array substrate and a manufacturing method thereof, capable of effectively reducing the cost, simplifying the process and improving the stability of an Oxide thin film transistor.

In an aspect of the invention, there is provided a manufacturing method of an array substrate comprising a first thin film transistor and a pixel electrode, an active layer and source and drain electrodes in the first thin film transistor as well as the pixel electrode are formed by one patterning process.

In an example, the source and drain electrodes and the pixel electrode each comprise a transparent electrode material.

In an example, the array substrate further comprises a second thin film transistor, active layers and source and drain electrodes in the first thin film transistor and the second thin film transistor as well as the pixel electrode are formed by one patterning process.

In an example, before formation of the first thin film transistor, the second thin film transistor and the pixel electrode, the further comprises:

depositing a gate metal thin film on a substrate, and forming a pattern that includes gate electrodes of the first thin film transistor and the second thin film transistor and a gate line by one patterning process;

forming a gate insulating layer on the substrate which has been subjected to the forgoing step, and forming a via hole by a patterning process, the via hole of the gate insulating layer being formed above the gate electrode of the second thin film transistor.

In an example, the gate insulating layer is subjected to an annealing process.

In an example, the gate insulating layer is a single-layered structure, and the gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film, a neodymium oxide thin film, a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; or the gate insulating layer is a bi-layered structure including a first gate insulating layer and a second gate insulating layer, the first gate insulating layer gets close to the gate layer, the second gate insulating layer gets close to the active layer, pattern of the first gate insulating layer adopts one selected from the group consisting of a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; and the second gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film; or the gate insulating layer is a three-layered structure including a third gate insulating layer, a fourth gate insulating layer and a fifth gate insulating layer, the third gate insulating layer gets close to the gate layer, the fifth gate insulating layer gets close to the active layer, the fourth gate insulating layer is located between the third gate insulating layer and the fifth gate insulating layer, the third gate insulating layer adopts one of a silicon nitride thin film, an aluminum nitride thin film, a zirconium nitride thin film and a tantalum nitride thin film; the fourth gate insulating layer adopts one of a silicon oxynitride thin film, an aluminum oxynitride thin film, a zirconium oxynitride thin film, a tantalum oxynitride thin film and a neodymium oxynitride thin film; and pattern of the fifth gate insulating layer adopts one of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film.

In an example, the active layers and the source and drain electrodes in the first thin film transistor and the second thin film transistor as well as the pixel electrode being formed by one patterning process comprises:

depositing an active layer thin film, a source/drain metal layer and a pixel electrode layer;

applying a photoresist;

conducting exposure and development with a dual-tone masking process, wherein, the connecting zone of a drain electrode of the first thin film transistor and a gate electrode of the second thin film transistor, a zone of a data line and a power supply line, a zone of source and drain electrodes of the first thin film transistor and the second thin film transistor, and a zone of the pixel electrode are photoresist fully-retained regions;

a first channel region of the first thin film transistor and a second channel region of the second thin film transistor are photoresist partially-retained regions; regions formed outside the above regions are photoresist fiffly-removed regions;

by a first etch process, removing the pixel electrode layer, the source/drain metal layer and the active layer thin film corresponding to the photoresist fully-removed regions;

removing the photoresist corresponding to the partially-retained regions by an ashing process, so as to form the first channel region and the second channel region;

by a second etch process, removing the pixel electrode layer and the source/drain metal layer corresponding to the photoresist partially-retained regions;

removing the remaining photoresist layer, so as to form pattern of the connecting zone of the drain electrode of the first thin film transistor and the gate electrode of the second thin film transistor, a pattern of the zone of the data line and the power supply line, a pattern of the zone of source and drain electrodes of the first thin film transistor and the second thin film transistor, and a pattern of the pixel electrode.

In an example, the source/drain metal layer includes a first metal layer and a second metal layer.

In an example, the active layer adopts one or more materials selected from the group consisting of IGZO, ITZO, IZO, $Cu_2O$, GZO, AZO, HfIZO and ZnON, or adopts one or more material(s) selected from the group consisting of amorphous silicon, polycrystalline silicon and microcrystalline silicon.

In an example, when the active layer adopts an oxide semiconductor material, plasma treatment under different atmosphere is conducted on the oxide semiconductor.

In an example, when the active layer adopts an oxide semiconductor material, under conditions of nitrogen gas, oxygen gas or air, annealing treatment is conducted on the oxide semiconductor layer, and the annealing temperature is in the range of 200° C. to 500° C.

In another aspect, an embodiment of the invention further provides an array substrate manufactured by using the above manufacturing method, comprising:

a substrate, a gate layer, a gate insulating layer, an active layer, a source/drain electrode layer and a pixel electrode layer being provided on the substrate, the source/drain electrode layer being in direct contact and connected with the pixel electrode layer.

In an example, the gate layer includes a first gate electrode of a first thin film transistor and a second gate electrode of a second thin film transistor;

the active layer includes a first active layer of the first thin film transistor and a second active layer of the second thin film transistor; the source/drain electrode layer includes a first source electrode and a first drain electrode of the first thin film transistor, and a second source electrode and a second drain electrode of the second thin film transistor.

In an example, the gate insulating layer has a via hole provided thereon, and the first drain electrode of the first thin film transistor is connected to the second gate electrode of the second thin film transistor through the via hole.

In an example, the source/drain metal layer includes a first metal layer and a second metal layer.

In an example, the gate layer and the source/drain electrode layer adopt one or more selected from the group consisting of copper, copper alloy, Mo, Mo—Al—Mo alloy, a stacked structure of Mo/Al—Nd/Mo, Al, Al alloy and Mo/Nd/Cu/Ti/Cu alloy.

In an example, the gate insulating layer is a single-layered structure, and the gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film, a neodymium oxide thin film, a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; or the gate insulating layer is a bi-layered structure including a first gate insulating layer and a second gate insulating layer, the first gate insulating layer gets close to the gate layer, the second gate insulating layer gets close to the active layer, pattern of the first gate insulating layer adopts one selected from the group consisting of a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; and the second gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film; or the gate insulating layer is a three-layered structure including a third gate insulating layer, a fourth gate insulating layer and a fifth gate insulating layer, the third gate insulating layer gets close to the gate layer, the fifth gate insulating layer gets close to the active layer, the fourth gate insulating layer is located between the third gate insulating layer and the fifth gate insulating layer, the third gate insulating layer adopts one of a silicon nitride thin film, an aluminum nitride thin film, a zirconium nitride thin film and a tantalum nitride thin film; the fourth gate insulating layer adopts one of a silicon oxynitride thin film, an aluminum oxynitride thin film, a zirconium oxynitride thin film, a tantalum oxynitride thin film and a neodymium oxynitride thin film; and pattern of the fifth gate insulating layer adopts one of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film.

In still another aspect, an embodiment of the invention further provides a display device that includes the above array substrate. With respect to a display device, an array substrate and a manufacturing method thereof provided by embodiments of the invention, by means of adjusting the process flow for manufacturing the array substrate, the production cycle of the thin film transistor can be shortened greatly, and moreover, as it goes through fewer process steps, characteristics of the thin film transistor can be improved favorably, so that the threshold voltage of the thin film transistor will not undergo a larger drift. Furthermore, the yield of products can be increased, and the stability and reliability of devices are made to be more suitable for long time use.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

According to embodiments of the invention, there is provided a manufacturing method of an array substrate that includes a first thin film transistor and a pixel electrode, and an active layer and source and drain electrodes of the first thin film transistor as well as the pixel electrode are formed by one patterning process. The source and drain electrodes and the pixel electrode each include a transparent electrode material, such as an indium tin oxide (ITO) material.

By means of accomplishing the active layer, the source and drain electrodes and the pixel electrode by using one patterning process, the production cycle of the thin film transistor can be shortened greatly, and moreover, as it goes through fewer process steps, characteristics of the thin film transistor can be improved favorably, so that the threshold voltage of the thin film transistor will not undergo a larger drift. Furthermore, the yield of products can be increased, and the stability and reliability of devices are made to be more suitable for long time use.

An array substrate made by the manufacturing method is applicable to common LCD display devices.

In addition, a manufacturing method suitable for an array substrate with a top-emission OLED structure is further provided by the invention.

Embodiment 1

According to an embodiment of the invention, there is provided a manufacturing method of an array substrate that includes a first thin film transistor, a second thin film transistor and a pixel electrode. Active layers and source and drain electrodes in the first thin film transistor and the second thin film transistor as well as the pixel electrode are formed by one patterning process.

The patterning process referred to in this application includes photoresist applying, masking, exposure, etching, photoresist removing and other process, and a positive photoresist is given as an example of the photoresist.

Figure 1:
FIG. 1 to FIG. 8 are structurally schematic views illustrating steps of a manufacturing method of an array substrate according to an embodiment of the invention.

For example, the method includes the following steps:

Step 1, a gate metal thin film is deposited on a substrate 321, and subjected to one patterning process, so as to form a gate line 11, a first gate electrode 3221 in a first thin film transistor and a second gate electrode 3222 in a second thin film transistor; referring to FIG. 1.

Figure 2:
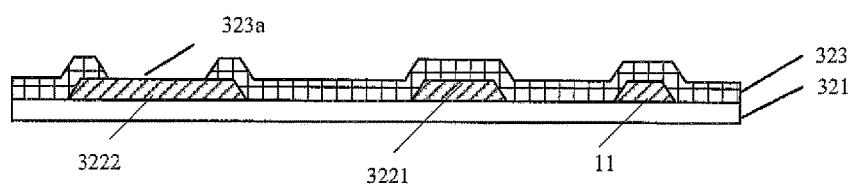

Step 2, a gate insulating layer 323 is formed on the substrate which has been subjected to step 101, and is subjected to a patterning process, so as to form a via hole 323a. The via hole of the gate insulating layer is formed over the gate electrode of the second thin film transistor, referring to FIG. 2.

Step 3, on the substrate which has been subjected to step 102, active layers and source and drain electrodes in the first thin film transistor and the second thin film transistor as well as a pixel electrode are formed by one patterning process.

For example, the step 3 includes:

Step 301, an active layer thin film 324, a source/drain metal layer and a pixel electrode layer 327 are deposited;

The source/drain metal layer may be a single-layered structure, and a bi-layered structure will be given in the embodiment as an example. The source/drain metal layer includes a first metal layer 325 for forming a source/drain electrode layer and a second metal layer 326 for forming a metal protective layer, so as to protect the source/drain electrode layer from being broken by external environment, referring to FIG. 3.

Figure 4:
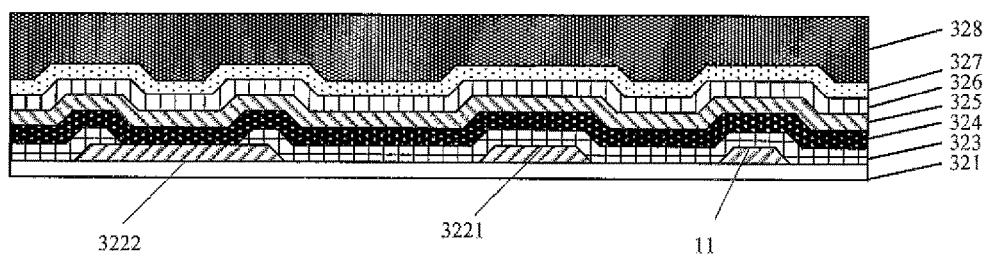

Step 302, a layer of photoresist 328 is applied, referring to FIG. 4.

Figure 5:
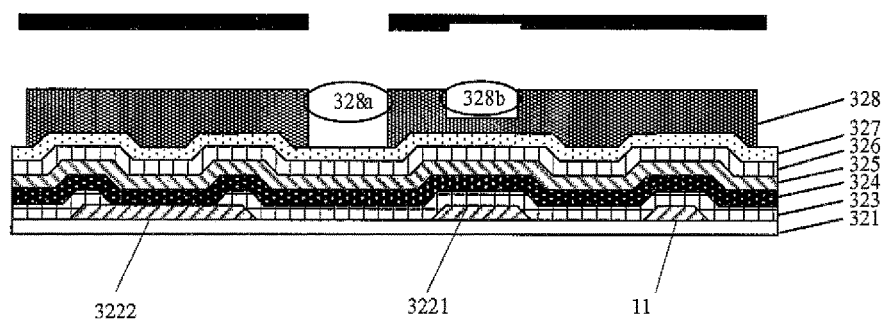

Step 303, a dual-tone masking process is adopted for exposure and development, the connecting zone of a drain electrode of the first thin film transistor and a gate electrode of the second thin film transistor, the zone of a data line 12 and a power supply line 14, the zone of source and drain electrodes of the first thin film transistor and the second thin film transistor, and the zone of a pixel electrode are photoresist fully-retained regions; the zone of a first channel of the first thin film transistor and the zone of a second channel of the second thin film transistor are photoresist partially-retained regions 328b, and regions formed outside the above regions are photoresist fully-removed regions 328a. Refer to FIG. 5.

Figure 6:
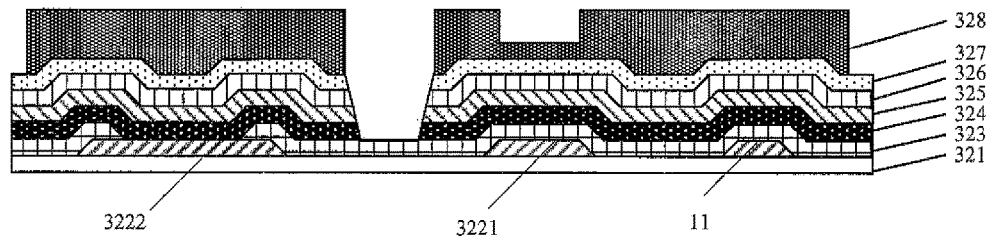

Step 304, through a first etch process, the pixel electrode layer, the source/drain metal layer and the active layer thin film in correspondence with the photoresist fully-removed regions are removed, namely, etching is conducted until reaching the gate insulating layer 323. Refer to FIG. 6.

Figure 7:
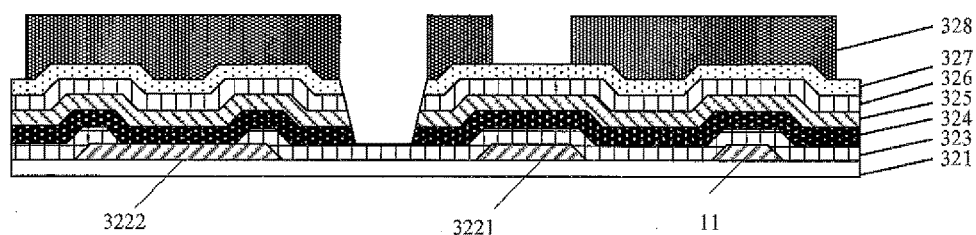

Step 305, the photoresist corresponding to the partially-retained regions are removed by an ashing process, so as to expose channel regions, referring to FIG. 7.

Figure 8:
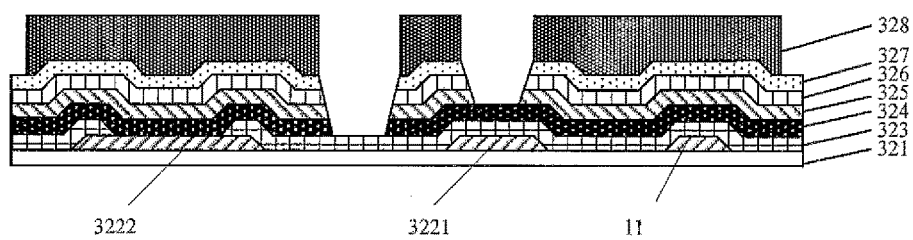

Step 306, through a second etch process, the pixel electrode layer and the source/drain metal layer in correspondence with the photoresist partially-retained regions are removed, so as to form pattern of the first channel in the first thin film transistor and pattern of the second channel of the second thin film transistor, referring to FIG. 8.

Figure 9:
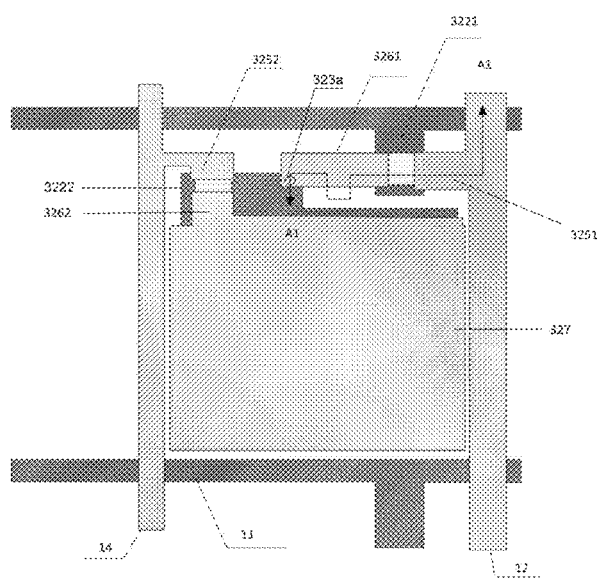
FIG. 9 is a schematic plan illustrating an array substrate provided by an embodiment of the invention.
Figure 10:
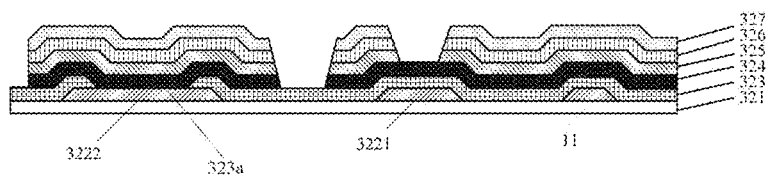
FIG. 10 is a view illustrating a cross section taken along A1-A1 of the array substrate according to the embodiment of the invention.

Step 307, the remaining photoresist layer is removed, so as to form pattern of the connecting zone of the drain electrode of the first thin film transistor and the gate electrode of the second thin film transistor, pattern of the zone of the data line and the power supply line, pattern of the zone of source and drain electrodes of the first thin film transistor and the second thin film transistor and pattern of the pixel electrode, referring to FIG. 9 and FIG. 10.

The etch process involved in the above steps may be a wet etching, a dry etching or a combined dry and wet etching.

The active layer adopts one or more material(s) selected from the group consisting of IGZO, ITZO, IZO, $Cu_2O$, GZO, AZO, HfIZO and ZnoN, or adopts one or more materials) selected from the group consisting of amorphous silicon, polycrystalline silicon and microcrystalline silicon.

When the active layer adopts an oxide semiconductor material, plasma treatment under different atmosphere is conducted on the oxide semiconductor. The atmosphere may be, such as, oxygen gas, argon gas, nitric oxide, hydrogen gas or a gas that can be used for surface modification of the oxide semiconductor. For example, a corrosion treatment is conducted on the semiconductor material in air with hydrogen plasma.

Or, under the conditions of nitrogen gas, oxygen gas or air, annealing treatment is conducted on the oxide semiconductor layer, and the annealing temperature is in the range of 200° C. to 500° C.

Embodiment 2

Figure 3:
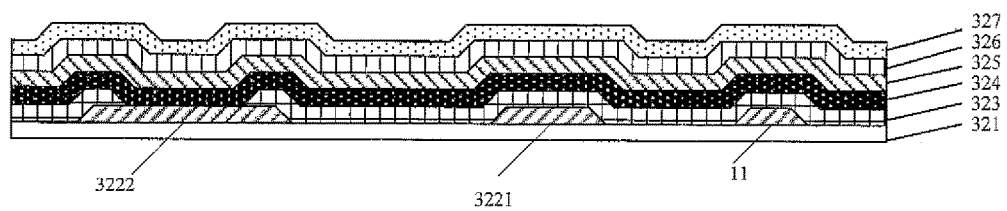

On the basis of the manufacturing method of the array substrate used in Embodiment 1, an array substrate is provided by an embodiment of the invention. FIG. 9 is planar graph illustrating an embodiment of the array substrate of the invention, what reflected by it is the structure of one pixel unit, and FIG. 10 is a view illustrating a cross section taken along A1-A1in FIG. 9. As illustrated in FIG. 3 and FIG. 4, the main structure of an OLED (Organic Light Emitting Diode) array substrate in the embodiment includes a gate line 11, a data line 12 and a power supply line 14, and the data line 12 and the power supply line 14 are perpendicular to the gate line 11, and serve to define a pixel region in conjunction with two adjacent gate lines 11. Within the pixel region, there are formed a first thin film transistor (also called as ,a switching thin film transistor) functioning as an addressing element, a second thin film transistor (also called as a driving thin film transistor) for controlling an organic light emitting diode and a pixel electrode, respectively. The first thin film transistor is located at the intersection point of the gate line 11 and the data line 12, and the second thin film transistor is located at the intersection point of the gate line 11 and the power supply line 14. A first drain electrode 3261 of the first thin film transistor is formed at the place where a gate electrode of the second thin film transistor is located, and is connected to a second gate electrode 3222.

For example, the array substrate includes a substrate 321, on which, a gate layer 322, a gate insulating layer 323, an active layer 324, a source/drain electrode layer and a pixel electrode layer 327 are provided, and the source/drain electrode layer and the pixel electrode layer are in direct contact and connected. The source/drain metal layer includes a first metal layer 325 and a second metal layer 326, the first metal layer 325 forms a normal source/drain metal layer, and the second metal layer 326 forms a metal protective layer, so as to protect the source/drain metal layer from being broken by external environment.

The gate layer includes a first gate electrode 3221 of the first thin film transistor and a second gate electrode 3222 of the second thin film transistor; and the first gate electrode 3221 and the second gate electrode 3222 as well as the gate line 11 are accomplished by one patterning process. The first gate electrode 3221 is connected to the gate line 11, the second gate electrode 3222 is not connected to the gate line 11, and meanwhile the first gate electrode 3221 is not connected to the second gate electrode 3222. The gate insulating layer 323 is formed on the first gate electrode 3221, the second gate electrode 3222 and the gate line 11.

A via hole 323a is provided on the gate insulating layer 323, and is located over the second gate electrode 3222. A first drain electrode 3261 of the first thin film transistor is connected to the second gate electrode 3222 of the second thin film transistor through the via hole 323a.

The active layer 324 includes a first active layer of the first thin film transistor and a second active layer of the second thin film transistor;

The source/drain electrode layer includes a first source electrode 3251 and a first drain electrode 3261 of the first thin film transistor, and a second source electrode 3252 and a second drain electrode 3262 of the second thin film transistor.

The gate layer 322 and the source/drain electrode layer in the embodiment adopt one or more selected from the group consisting of copper, copper alloy, Mo, Mo—Al—Mo alloy, a stacked structure of Mo/Al—Nd/Mo, Al, Al alloy and Mo/Nd/Cu/Ti/Cu alloy.

It is to be noted that, names of a source electrode and a drain electrode of a thin film transistor vary with difference in the flowing direction of a current, and for the sake of descriptive convenience in the invention, what is connected to a pixel electrode is called as a drain electrode. The channel region is an interval zone corresponding to the source electrode and the drain electrode.

The gate insulating layer 323 may be a single-layered structure, i.e. a first gate insulating layer. The gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film, a neodymium oxide thin film, a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film. For the purpose of ensuring better device characteristics, in the embodiment, an annealing process may be conducted on the first gate insulating layer (that is, the first gate insulating layer is an insulating layer subjected to an annealing process), so as to reduce influences of hydrogen element and a compound of hydrogen in the gate insulating layer on characteristics of the oxide semiconductor, A specific annealing process method includes, a heating chamber with nitrogen gas or air is added into a PECVD equipment, and a dehydrogenation process is conducted on the first gate insulating layer; wherein, the temperature of the annealing chamber is in the range of 200° C. to 350° C., and the annealing time is in the range of 15 minutes to 90 minutes.

The gate insulating layer 323 may be a bi-layered structure, that is, it includes a first gate insulating layer and a second gate insulating layer. The first gate insulating layer gets close to the gate electrode, and the second gate insulating layer gets close to the active layer.

The first gate insulating layer adopts one selected from the group consisting of a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; and the second gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film. The first gate insulating layer and/or the second gate insulating layer are/is insulating layers subjected to an annealing process. The material for the first gate insulating can act to well suppress the poorness produced by the gate electrode (especially when copper or a copper alloy is used). The role of the second gate insulating layer is that matching with the oxide semiconductor can be well realized by it, thereby achieving the function of improving performance of the device. Materials for the second gate insulating layer are mostly oxide insulating layers, the anti-diffusion ability of which with respect to $H^+$, $OH^-$ and other groups is relatively poor, and so, when the first gate insulating layer is finished by manufacture, preferably, it is necessary to conduct an annealing process treatment on it. Its role is to reduce $H^+$, $OH^-$ and other groups that may undergo fracture and diffusion in the first gate insulating layer, and in turn, a function of promoting stability of the device is achieved.

A specific annealing process method includes, a heating chamber with nitrogen gas or air is added into a PECVD equipment, and a dehydrogenation process is conducted on the first gate insulating layer and/or the second gate insulating layer; wherein, the temperature of the annealing chamber is in the range of 200° C. to 350° C., and the annealing time is in the range of 15 minutes to 90 minutes. The gate insulating layer 323 is a three-layered structure, that is, it includes a third gate insulating layer, a fourth gate insulating layer and a fifth gate insulating layer. The third gate insulating layer gets close to the gate electrode, the fifth gate insulating layer gets close to the active layer, and the fourth gate insulating layer is located between the third gate insulating layer and the fifth gate insulating layer. Pattern of the third gate insulating layer adopts one of a silicon nitride thin film, an aluminum nitride thin film, a zirconium nitride thin film and a tantalum nitride thin film; pattern of the fourth gate insulating layer adopts one of a silicon oxynitride thin film, an aluminum oxynitride thin film, a zirconium oxynitride thin film, a tantalum oxynitride thin film and a neodymium oxynitride thin film; and pattern of the fifth gate insulating layer adopts one of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film.

In the embodiment, the third gate insulating layer adopts a thin film of silicon nitride or silicon oxynitride or other inorganic insulating material. In view of the fact that the material may cause performance of the oxide semiconductor layer to degrade when it directly contacts with the oxide semiconductor layer, but it can nicely suppress occurrence of an undesired phenomenon upon contact with a gate metal (especially when copper and its alloy are used as the gate electrode), the first gate insulating layer is disposed to attach closely to the gate electrode, and to be far away from the active layer. The fourth gate insulating layer is arranged in the middle layer, and due to the fact that the fourth gate insulating layer made of a silicon oxynitride thin film or other inorganic insulating material contains fewer $H^+$, $OH^-$ and other groups itself, and meanwhile it has a certain anti-penetration ability with respect to $H^+$, $OH^-$ and other groups so that it can nicely suppress diffusion of $H^+$, $OH^-$ and other groups to the oxide semiconductor layer, a goal of enhancing stability of the device is achieved. Furthermore, in order to enhance characteristics of the device to the maximum extent, the fifth gate insulating layer is attached closely to the oxide semiconductor. Thus, matching with the oxide semiconductor can be well realized, and a function of improving stability of the device is achieved.

According to an embodiment of the invention, there is further provided a display device, including the above array substrate. The display device may be a liquid crystal panel, an electronic paper, an OLED panel, a cell phone, a tablet computer, a television, a display, a notebook computer, a digital photo frame, a navigator or any other product or component having a display function.

The above embodiments are merely some examples of the invention. In other embodiments, for example, ion implementation, plasma treatment or other process may be conducted on a part of active layer directly below a source electrode and/or a drain electrode according to requirements, so as to increase conductivity of this part of active layer.

Descriptions made above are merely exemplary embodiments of the invention, but are not used to limit the protection scope of the invention. The protection scope of the invention is determined by attached claims.

This application claims the benefit of priority from Chinese patent application No. 201410004069.1, filed on Jan. 3, 2014, the disclosure of which is incorporated herein in its entirety by reference as a part of the present application.

The invention claimed is:

1. A manufacturing method of an array substrate comprising a first thin film transistor and a pixel electrode, wherein, an active layer and source and drain electrodes in the first thin film transistor as well as the pixel electrode are formed by one patterning process,
    wherein the array substrate further comprises a second thin film transistor, active layers and source and drain electrodes in the first thin film transistor and the second thin film transistor as well as the pixel electrode are formed by one patterning process, the method comprising:
    depositing an active layer thin film, a source/drain metal layer and a pixel electrode layer;
    applying photoresist;
    conducting exposure and development with a dual-tone masking process,
    performing etching and ashing, and
    removing a remaining photoresist layer to form a pattern of the connecting zone of the drain electrode of the first thin film transistor and the gate electrode of the second thin film transistor, a pattern of the zone of the data line and the power supply line, a pattern of the zone of source and drain electrodes of the first thin film transistor and the second thin film transistor, and a pattern of the pixel electrode.

2. The manufacturing method of the array substrate according to claim 1, wherein, the source and drain electrodes and the pixel electrode each comprise a transparent electrode material.

3. The manufacturing method of the array substrate according to claim 1, wherein, before formation of the first thin film transistor, the second thin film transistor and the pixel electrode, the method further comprises:
  depositing a gate metal thin film on a substrate, and forming a pattern that includes gate electrodes of the first thin film transistor and the second thin film transistor and a gate line by one patterning process;
  forming a gate insulating layer on the substrate which has been subjected to the forgoing step, and forming a via hole by a patterning process, the via hole of the gate insulating layer being formed above the gate electrode of the second thin film transistor.

4. The manufacturing method of the array substrate according to claim 1, wherein, the gate insulating layer is subjected to an annealing process.

5. The manufacturing method of the array substrate according to claim 4, wherein, the gate insulating layer is a single-layered structure, and the gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film, a neodymium oxide thin film, a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; or
  the gate insulating layer is a bi-layered structure including a first gate insulating layer and a second gate insulating layer, the first gate insulating layer gets close to the gate layer, the second gate insulating layer gets close to the active layer, pattern of the first gate insulating layer adopts one selected from the group consisting of a silicon oxynitride thin film, an aluminum oxynitride thin film, a zirconium oxynitride thin film, a tantalum oxynitride thin film, a neodymium oxynitride thin film, a silicon nitride thin film, an aluminum nitride thin film, a zirconium nitride thin film and a tantalum nitride thin film; and the second gate insulating layer adopts one selected from the group consisting of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film; or
  the gate insulating layer is a three-layered structure including a third gate insulating layer, a fourth gate insulating layer and a fifth gate insulating layer, the third gate insulating layer gets close to the gate layer, the fifth gate insulating layer gets close to the active layer, the fourth gate insulating layer is located between the third gate insulating layer and the fifth gate insulating layer, the third gate insulating layer adopts one of a silicon nitride thin film, an aluminum nitride thin film, a zirconium nitride thin film and a tantalum nitride thin film; the fourth gate insulating layer adopts one of a silicon oxynitride thin film, an aluminum oxynitride thin film, a zirconium oxynitride thin film, a tantalum oxynitride thin film and a neodymium oxynitride thin film; and pattern of the fifth. gate insulating layer adopts one of a silicon oxide thin film, an aluminum oxide thin film, a titanium oxide thin film, a silicon oxynitride thin film, a zirconium oxide thin film, a tantalum oxide thin film, a barium titanate thin film and a neodymium oxide thin film.

6. The manufacturing method of the array substrate according to claim 1, further comprising the step of,
  conducting exposure and development with a dual-tone masking process comprising:
    a connecting zone of a drain electrode of the first thin film transistor and a gate electrode of the second thin film transistor, a zone of a data line and a power supply line, a zone of source and drain electrodes of the first thin film transistor and the second thin film transistor, and a zone of the pixel electrode are photoresist fully-retained regions;
    a first channel region of the first thin film transistor and a second channel region of the second thin film transistor are photoresist partially-retained regions;
    regions formed outside the above regions are photoresist fully-removed regions, and
  performing etching and ashing comprising:
    by a first etch process, removing the pixel electrode layer, the source/drain metal layer and the active layer thin film corresponding to the photoresist fully-removed regions;
    removing the photoresist corresponding to the partially-retained regions by an ashing process, so as to form the first channel region and the second channel region;
    by a second etch process, removing the pixel electrode layer and the source/drain metal layer corresponding to the photoresist partially-retained regions.

7. The manufacturing method of the array substrate according to claim 1, wherein, the source/drain metal layer includes a first metal layer and a second metal layer.

8. The manufacturing method of the array substrate according to claim 1, wherein, the active layer adopts one or more materials selected from the group consisting of IGZO, ITZO, IZO, $Cu_2O$, GZO, AZO, HfIZO and ZnoN, or adopts one or more materials selected from the group consisting of amorphous silicon, polycrystalline silicon and microcrystalline silicon.

9. The manufacturing method of the array substrate according to claim 1, wherein, when the active layer adopts an oxide semiconductor material, plasma treatment under different atmosphere is conducted on the oxide semiconductor.

10. The manufacturing method of the array substrate according to claim 1, wherein, when the active layer adopts an oxide semiconductor material, under conditions of nitrogen gas, oxygen gas or air, annealing treatment is conducted on the oxide semiconductor layer, and the annealing temperature is in the range of 200° C. to 500 C.

11. The manufacturing method of the array substrate according to claim 2, wherein, the source/drain metal layer includes a first metal layer and a second metal layer.

* * * * *